United States Patent
Schuehrer et al.

(10) Patent No.: US 8,097,536 B2
(45) Date of Patent: Jan. 17, 2012

(54) REDUCING METAL VOIDS IN A METALLIZATION LAYER STACK OF A SEMICONDUCTOR DEVICE BY PROVIDING A DIELECTRIC BARRIER LAYER

(75) Inventors: Holger Schuehrer, Dresden (DE); Juergen Boemmels, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 105 days.

(21) Appl. No.: 12/565,323

(22) Filed: Sep. 23, 2009

(65) Prior Publication Data

US 2010/0109161 A1    May 6, 2010

(30) Foreign Application Priority Data

Oct. 31, 2008 (DE) .......................... 10 2008 054 068

(51) Int. Cl.
*H01L 21/4763* (2006.01)
(52) U.S. Cl. .......... 438/639; 257/E23.011; 257/E21.585
(58) Field of Classification Search .................. 438/637, 438/639, 687, 641, 653, 738; 257/E23.011, 257/E21.577, E21.585
See application file for complete search history.

(56) References Cited

U.S. PATENT DOCUMENTS

| 6,187,672 B1 * | 2/2001 | Zhao et al. .................... 438/639 |
| 6,284,657 B1 | 9/2001 | Chooi et al. ................... 438/687 |
| 6,362,012 B1 * | 3/2002 | Chi et al. .......................... 438/3 |
| 7,338,895 B2 | 3/2008 | Kumar et al. ................. 438/637 |
| 2003/0157794 A1 * | 8/2003 | Agarwala et al. ............. 438/627 |
| 2004/0147112 A1 | 7/2004 | Tsu et al. ...................... 438/637 |

FOREIGN PATENT DOCUMENTS

| EP | 1 263 035 A1 | 12/2002 |
| WO | WO2007/099428 A1 | 9/2007 |

\* cited by examiner

*Primary Examiner* — Thomas L Dickey
*Assistant Examiner* — Nikolay Yushin
(74) *Attorney, Agent, or Firm* — Williams, Morgan & Amerson, P.C.

(57) ABSTRACT

Metallization systems on the basis of copper and low-k dielectric materials may be efficiently formed by providing an additional dielectric material of enhanced surface conditions after the patterning of the low-k dielectric material. Consequently, defects such as isolated copper voids and the like may be reduced without significantly affecting overall performance of the metallization system.

14 Claims, 7 Drawing Sheets

US 8,097,536 B2

REDUCING METAL VOIDS IN A METALLIZATION LAYER STACK OF A SEMICONDUCTOR DEVICE BY PROVIDING A DIELECTRIC BARRIER LAYER

BACKGROUND OF THE INVENTION

1. Field of the Invention

Generally, the present disclosure relates to integrated circuits, and, more particularly, to metallization layers of reduced permittivity by using low-k dielectric materials in combination with highly conductive metals, such as copper, that require appropriate confinement in the dielectric material.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal containing lines, providing the inner-level electrical connection, and also include a plurality of inter-level connections, also referred to as vias, filled with an appropriate metal. The vias provide electrical connection between two neighboring stacked metallization layers, wherein the metal-containing lines and vias may also be commonly referred to as interconnect structures.

Due to the ongoing demand for shrinking the feature sizes of highly sophisticated semiconductor devices, highly conductive metals, such as copper and alloys thereof, in combination with a low-k dielectric material, have become a frequently used alternative in the formation of metallization layers. Typically, a plurality of metallization layers stacked on top of each other is necessary to realize the connections between all internal circuit elements and I/O (input/output), power and ground pads of the circuit design under consideration. For extremely scaled integrated circuits, the signal propagation delay, and thus the operating speed of the integrated circuit, may no longer be limited by the semiconductor elements, such as transistors and the like, but may be restricted, owing to the increased density of circuit elements requiring an even more increased number of electrical connections, by the close proximity of the metal lines, since the line-to-line capacitance is increased, which is accompanied by the fact that the metal lines have a reduced conductivity due to a reduced cross-sectional area. For this reason, traditional dielectrics, such as silicon dioxide (k>5) and silicon nitride (k>7), are replaced by dielectric materials having a lower permittivity, which are therefore also referred to as low-k dielectrics having a relative permittivity of 3 or less. The reduced permittivity of these low-k materials is frequently achieved by providing the dielectric material in a porous configuration, thereby achieving a k-value of significantly less than 3.0. Due to the intrinsic properties, such as a high degree of porosity, of the dielectric material, however, the density and mechanical stability or strength may be significantly less compared to the well-approved dielectrics silicon dioxide and silicon nitride.

During the formation of copper-based metallization layers, a so-called damascene or inlaid technique is usually used due to copper's characteristic of not forming volatile etch products when being exposed to well-established anisotropic etch ambients. In addition, copper may also not be deposited with high deposition rates on the basis of well-established deposition techniques usually used for aluminum, such as chemical vapor deposition (CVD). Thus, in the inlaid technique, therefore, the dielectric material is patterned to receive trenches and/or vias, which are subsequently filled with the metal by an efficient electrochemical deposition technique. During the etch process, the low-k material may be damaged, thereby further reducing the mechanical integrity thereof. The etch damage, in combination with a high number of additional surface irregularities in the form of tiny cavities due to, for instance, the porosity, may require a post-etch treatment for "sealing" the low-k material prior to filling in the metal. Moreover, a barrier layer is usually to be formed on exposed surface portions of the dielectric material prior to filling in the metal, which provides the desired adhesion of the metal to the surrounding dielectric material and also suppresses copper diffusion into sensitive device areas as copper may readily diffuse in a plurality of dielectric materials, in particular in porous low-k dielectrics. Furthermore, the performance of the metal lines and vias with respect to stress-induced metal migration, such as electromigration, may strongly depend on the characteristics of an interface between the metal and the dielectric material, thus rendering a reliable coverage of the low-k dielectric material an important aspect for the performance of the metallization layer. The reliable coverage of exposed surfaces of the low-k dielectric material within high aspect ratio openings, typically required in sophisticated applications involving feature sizes of approximately 50 nm and less, by presently established barrier deposition techniques, such as sputter deposition and the like, may not be a straightforward development and, hence, may significantly degrade production yield and product reliability.

Moreover, in various inspection procedures after forming a metallization layer on the basis of a low-k dielectric material and copper, additional defects in the form of island-like voids in the metal have been observed, which may also represent a significant source of performance degradation and yield loss, in particular when a large number of metallization layers is to be provided due to the complex overall circuit layout. Although the reason for the occurrence of these metal defects is not yet clearly understood, it is believed that these voids may be created due to the complex interrelation between the many manufacturing processes and the materials involved, in particular when critical dimensions in the above-specified range have to be provided in the semiconductor device. On the other hand, this type of metal defect may typically be avoided in metallization layers comprising a less critical interlayer dielectric material, such as silicon dioxide, even if doped with fluorine, since it is believed that the significantly higher density of this material may result in enhanced process conditions. However, as explained above, the usage of high density dielectric materials in the form of silicon dioxide, which typically have a significantly higher dielectric constant, may be less than desirable in view of signal propagation delay caused by parasitic RC (resistive capacitance) time constants in the metallization level.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and methods for forming the same in which complex metallization systems of semiconductor devices may be formed on the basis of low-k dielectric materials, wherein, however, after patterning the low-k dielectric material and prior to filling respective trenches and vias with a conductive material, the surface conditions of the corresponding device topography may be modified so as to avoid the probability of creating metal defects, for instance in the form of single island-like voids. For this purpose, exposed surface areas of the low-k dielectric material may be covered by an appropriate dielectric material providing desired surface conditions during the subsequent deposition of a conductive barrier material and/or seed material, followed by the electrochemical deposition of the copper-based metal. In some illustrative aspects, a silicon dioxide based material may be formed prior to the deposition of the conductive barrier material, thereby providing process conditions that may be similar to well-established process regimes for metallization systems formed on the basis of silicon dioxide based dielectric material. In still other illustrative aspects disclosed herein, a dielectric material having a diffusion blocking effect with respect to the copper species may be provided, thereby significantly relaxing any constraints imposed on a subsequently deposited barrier material, which may thus be provided with a significantly reduced layer thickness. In other cases, the deposition of the additional dielectric material may be used for adjusting the lateral size of the corresponding openings, thereby providing enhanced flexibility in adjusting critical dimensions for given lithography and patterning capabilities.

One illustrative method disclosed herein comprises forming an opening in a low-k dielectric layer of a metallization layer that is formed above a substrate of a semiconductor device. The method further comprises forming a dielectric layer in the opening, wherein the dielectric layer has a higher density relative to the low-k dielectric layer. Additionally, the method comprises exposing a conductive material of a conductive region at a bottom of the opening by removing material of the dielectric layer. Furthermore, a conductive barrier material is deposited in the opening and the opening is then filled with a metal.

A further illustrative method disclosed herein comprises forming a silicon dioxide material above exposed surfaces of an opening formed in a low-k dielectric material of a metallization layer of a semiconductor device. The method further comprises removing the silicon dioxide material at a bottom of the opening, while maintaining at least a portion of the silicon dioxide material at sidewalls of the opening. Finally, the method comprises filling the opening with a metal-containing conductive material.

One illustrative semiconductor device disclosed herein comprises a copper-containing metal region that is formed in a dielectric layer of a metallization layer, wherein the metal region extends to a conductive region. Moreover, the semiconductor device comprises a first dielectric material of the dielectric layer that is formed on sidewalls of the copper-containing metal region. Furthermore, a second dielectric material of the dielectric layer is formed on the first dielectric material, wherein the first dielectric material has a first dielectric constant that is higher than a second dielectric constant of the second dielectric material. The second dielectric constant is less than approximately 3.0.

BRIEF DESCRIPTION OF THE DRAWINGS

The disclosure may be understood by reference to the following description taken in conjunction with the accompanying drawings, in which like reference numerals identify like elements, and in which.

Figure 1A:
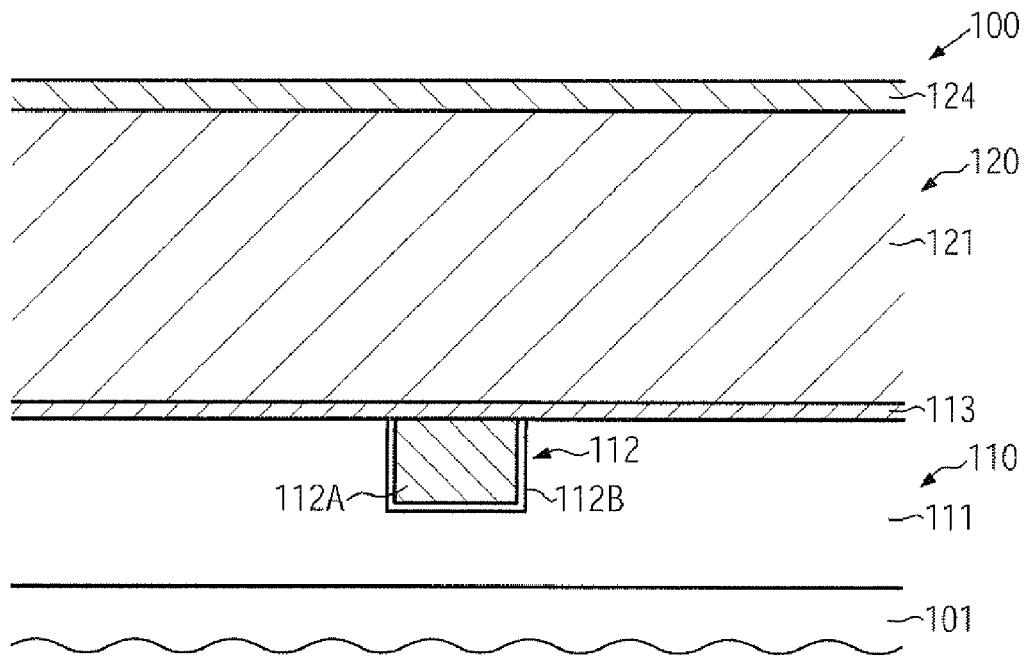
FIG. 1a schematically illustrates a cross-sectional view of an illustrative semiconductor device in accordance with one embodiment of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure relates to semiconductor devices and methods in which sophisticated metallization systems of semiconductor devices may be formed on the basis of low-k dielectric materials and highly conductive metals, such as copper, copper alloys, silver and the like, wherein the low-k dielectric material may be understood as a material having a dielectric constant of 3.0 and less. It should be appreciated that the principles disclosed herein may also be advantageously applied to highly sensitive dielectric materials, which may also be referred to as ULK (ultra low-k) materials having a dielectric constant of 2.7 and significantly less, wherein these materials may also exhibit a certain degree of porosity, which may also contribute to sophisticated process conditions during the patterning of the low-k dielectric materials. In order to reduce defects, such as metal voids in the form of isolated island-like areas, prior to actually filling the corresponding openings, such as trenches and/or vias, an appropriate dielectric material having enhanced material density or a higher dielectric constant may be provided, which may thus enhance the overall process efficiency during the further processing. The additional dielectric material, such as silicon dioxide, may be provided with an appropriate thickness so as to not unduly affect the overall electrical performance of the metallization layer under consideration, while in other cases the corresponding layer thickness may be appropriately selected with respect to adjusting the lateral dimensions of the openings. For example, upon process-sensitive low-k dielectric materials, such as ULK materials, the complex process sequence during the patterning of these materials may result in a certain degree of surface damage, which may typically result in reduced reliability and lower electrical performance of the corresponding metallization systems. In this case, the damaged material may be efficiently removed and may be replaced by a dielectric material that provides the desired surface conditions during the further processing while also enabling re-establishing the initial lateral size of the openings. In other cases, any appropriate layer thickness may be selected so as to finally adjust the lateral size of the opening, thereby enabling the patterning of highly critical openings on the basis of well-established lithography and etch techniques. Consequently, well-established dielectric materials, such as silicon dioxide that may be formed on the basis of TEOS (tetra ethyl ortho silicate), may be used after the patterning of sensitive low-k dielectric materials, while not unduly negatively affecting the overall electrical performance, while in some cases a very efficient adjustment of the finally desired lateral dimensions may be accomplished on the basis of the additional dielectric material.

FIG. 1a schematically illustrates a cross-sectional view of a semiconductor device 100 at an advanced manufacturing stage. The semiconductor device 100 may comprise a substrate 101, such as a semiconductor substrate, an insulating substrate and the like, in and above which an appropriate semiconductor material may be provided so as to form therein circuit elements, such as transistors, capacitors, resistors and the like, as is required in accordance with the overall circuit configuration of the device 100. It should be appreciated that, for convenience, any such circuit elements are not shown in FIG. 1a. For example, the circuit elements formed in and above the substrate 101 may have critical dimensions, such as the gate length of field effect transistors, of approximately 50 nm and less. Moreover, the semiconductor device 100 may comprise a first device level 110, which may represent a metallization layer or a contact structure that may include a conductive region 112 that is embedded in a dielectric material 111. For example, silicon dioxide, possibly in combination with silicon nitride, may represent well-established dielectric materials for forming a contact structure in which corresponding contact elements may connect to the contact areas of circuit elements, such as transistors and the like. If the device level 110 represents a metallization layer, the conductive region 112 may comprise a highly conductive metal 112A, such as copper and the like, possibly in combination with an appropriate conductive barrier material 112B, such as tantalum, tantalum nitride and the like. Furthermore, an etch stop or capping layer 113, for instance comprised of silicon nitride, nitrogen-containing silicon carbide and the like, may be formed above the dielectric material 111 and the conductive region 112, thereby confining the metal 112A when critical metals, such as copper, are considered. Furthermore, in the manufacturing stage shown, the semiconductor device 100 may comprise a metallization layer 120 comprising a low-k dielectric material, possibly in the form of a porous material and the like, as previously explained, which may have a dielectric constant of 3.0 and less. For example, a plurality of material compositions, including silicon, oxygen, hydrogen and carbon, are well established in the art and may be used in a more or less porous state as a low-k dielectric material. In other cases, polymer materials and the like may be used as the low-k dielectric material 121. Moreover, a hard mask material 124, such as silicon oxynitride, silicon nitride and the like, may be formed above the dielectric material 121 and may be appropriately designed to act as an anti-reflective coating (ARC) material, if desired.

The semiconductor device 100 as shown in FIG. 1a may be formed on the basis of well-established process techniques. That is, after forming any circuit elements in and above the substrate 101, including sophisticated process techniques, the device level 110 may be formed, for instance, by depositing the dielectric material 111 and patterning the same so as to obtain a corresponding opening, which may subsequently be filled with the materials 112B and 112A. If the layer 110 represents a metallization layer, similar manufacturing techniques may be used as will be described with reference to the metallization layer 120. Thus, after completing the patterning of the dielectric material 111 and forming the conductive region 112, the etch stop layer or cap layer 113 may be formed by well-established deposition techniques. Thereafter, the low-k dielectric material 121 may be deposited, for instance, by CVD, spin-on procedures and the like, depending on the type of material to be used. It should be appreciated that the dielectric material 121 may comprise different material compositions, as may be required according to the process strategy under consideration. Next, the hard mask material 124 may be formed, for instance, by plasma enhanced CVD techniques and the like.

Figure 1B:
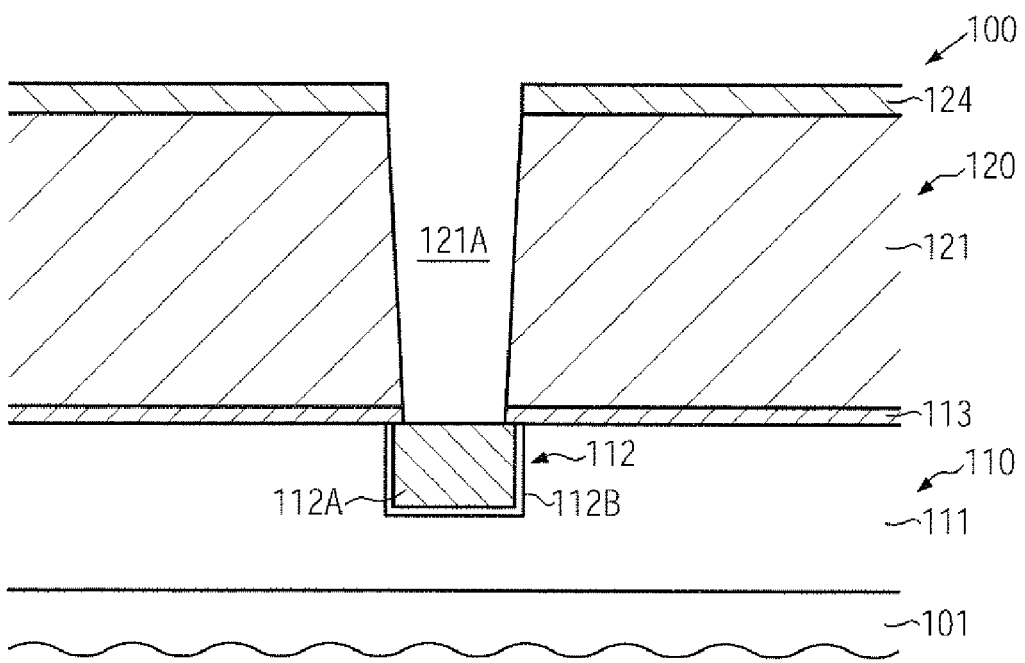
FIG. 1b schematically illustrates one illustrative embodiment of the semiconductor device of FIG. 1a in a further advanced manufacturing stage.

FIG. 1b schematically illustrates the semiconductor device 100 in an advanced manufacturing stage. As illustrated, an opening 121A, such as a trench or a via opening, may be formed in the dielectric material 121 and the hard mask layer 124 and may extend, in the manufacturing stage shown, to the conductive region 112. The opening 121A may be formed on the basis of well-established process techniques in which a resist mask may be formed on the basis of a complex lithography step. The resist mask may be used to pattern the hard mask layer 124, which then in turn may act as an etch mask for etching into the dielectric material 121 on the basis of well-established anisotropic plasma-based etch techniques. During the corresponding etch process, the layer 113 may act as an efficient etch stop material, which may subsequently be etched to expose the portion of the conductive region 112, when any further etch processes may not be required in the material 121. In other cases, additional etch steps may be performed, for instance for etching trench openings in an upper portion of the dielectric material 121, as will be described later on in more detail, wherein the etch stop layer 113 may protect the conductive region 112. After opening the etch stop layer 113, one or more cleaning processes may be performed, for instance on the basis of wet chemical etch chemistries, such as hydrofluoric acid (HF), ammonium peroxide mixture (APM) and the like. During the corresponding wet chemical etch process, etch byproducts of the previous anisotropic etch process, as well as other contaminations, may be efficiently removed.

Figure 1C:
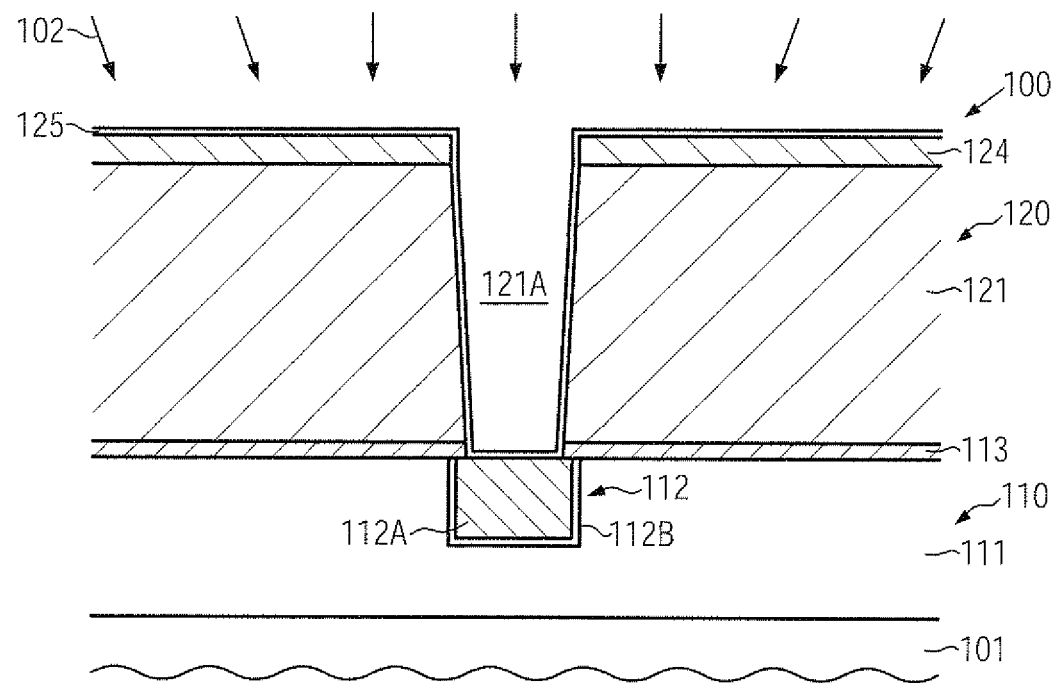
FIG. 1c schematically illustrates another illustrative embodiment of the present disclosure, wherein the semiconductor device of FIG. 1b is in yet a further manufacturing stage.

FIG. 1c schematically illustrates the semiconductor device 100 when exposed to a deposition ambient 102 used for depositing a dielectric layer 125 that has a higher density compared to the low-k dielectric material 121. For example, the dielectric layer 125 may be comprised of silicon dioxide, which represents a well-established dielectric material in the field of semiconductor fabrication and which may have significantly different characteristics with respect to the deposition of subsequent materials, such as a conductive barrier material and the like. As previously explained, silicon dioxide formed on the basis of TEOS may be used as an interlayer dielectric material for metallization layers with less critical constraints in view of signal propagation delay, wherein a certain type of defect, such as island-like voids in metal regions, may be significantly lower compared to sensitive dielectric materials such as the material 121. Thus, in some illustrative embodiments, the deposition process 102 may be performed on the basis of TEOS as a precursor material using well-established deposition recipes, such as thermally activated CVD, plasma enhanced CVD and the like, in order to obtain the layer 125 with a desired thickness of approximately 5-20 nm, depending on the overall device and process requirements. In other illustrative embodiments, the dielectric layer 125 may be provided in the form of a different material composition or may be provided in the form of two or more sub-layers, as will be described later on in more detail. Furthermore, as illustrated, well-established process parameters may be selected to deposit the layer 125 in a very conformal manner so that a substantially constant layer thickness may be obtained, at least within the opening 121A.

Figure 1D:
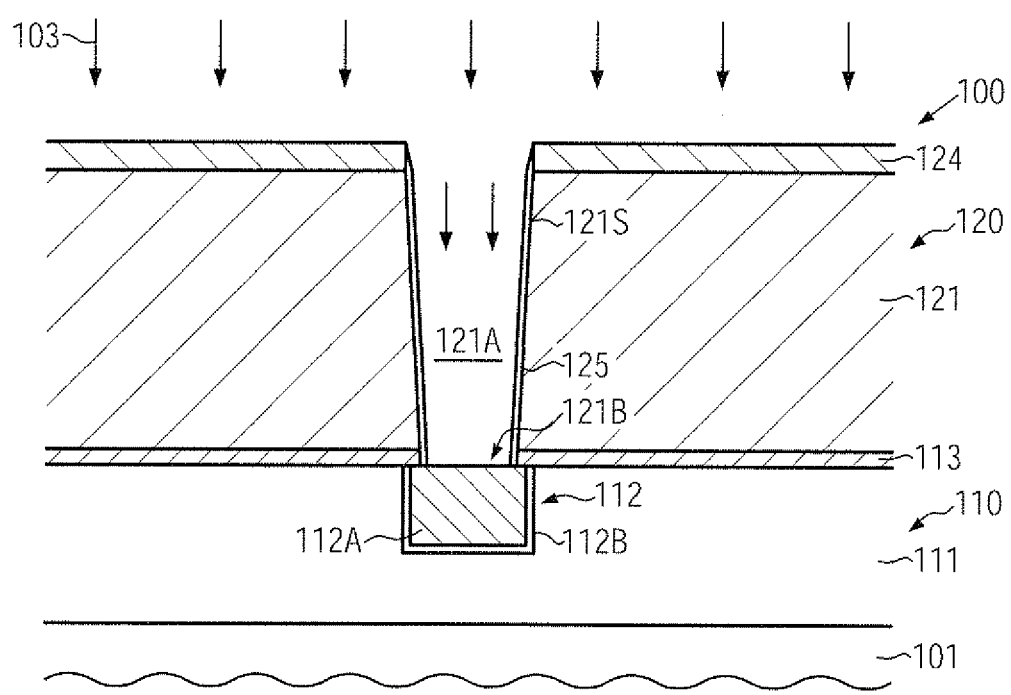
FIG. 1d schematically illustrates yet another illustrative embodiment disclosed herein, depicting the illustrative semiconductor device shown in FIG. 1c in an advanced manufacturing stage.

FIG. 1d schematically illustrates the semiconductor device 100 during an etch process 103 that is designed to preferably remove material from horizontal device portions, such as the bottom 121B of the opening 121A. For this purpose, the etch process 103 may be performed on the basis of a plasma assisted anisotropic etch recipe so as to remove material of the layer 125 in order to reliably expose the conductive region 112. For example, appropriate anisotropic etch recipes on the basis of a fluorine chemistry are well established in the art. It should be noted that a pronounced selectivity of the etch process 103 with respect to other materials may not be required since, due to the reduced thickness of the layer 125, a significant consumption of other materials may not occur until the conductive region 112 is reliably exposed. On the other hand, the sidewalls 121S of the opening 121A may remain covered by at least a portion of the dielectric material 125 due to the anisotropic nature of the process 103. In other illustrative embodiments, the etch process or removal process 103 may represent a "sputter etch" process, in which material removal of the layer 125 may mainly be caused by the physical impact of accelerated particles, such as argon particles and the like, which may be created in a corresponding plasma ambient. Thus, also in this case, a highly anisotropic etch behavior may be obtained, thereby preferably removing material from horizontal portions, such as the bottom 121B. In one illustrative embodiment, the corresponding sputter etch process 103 may be performed during an initial phase for depositing an appropriate conductive barrier material on the basis of a sputter deposition technique. Thus, in this case, the conductive region 112 may be efficiently exposed during the process 103, the atmosphere of which may then be appropriately changed so as to initiate the deposition of a desired conductive barrier material, such as tantalum, tantalum nitride and the like.

Figure 1E:
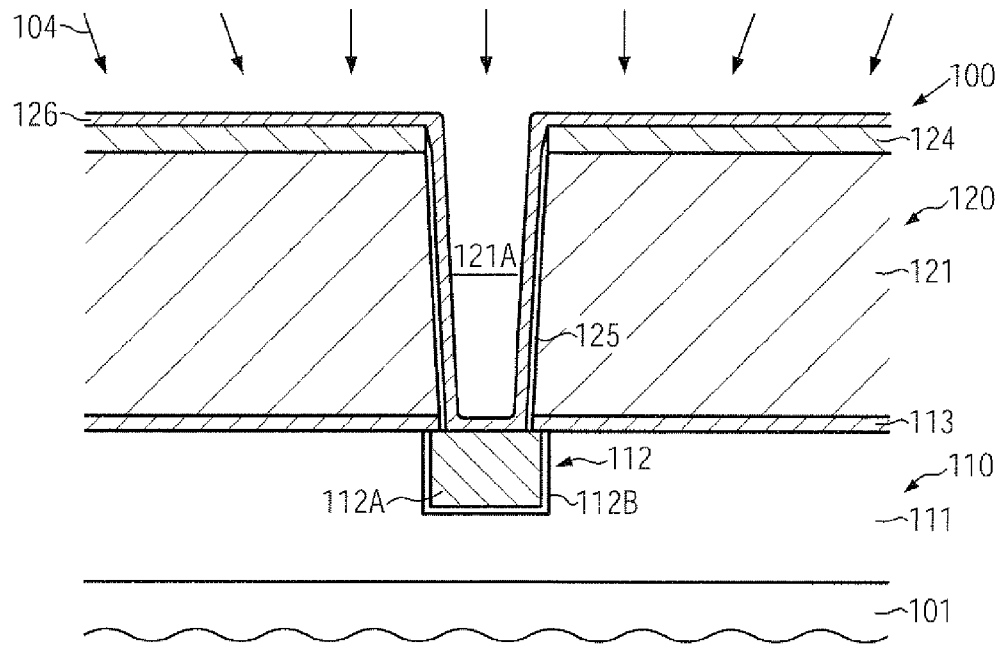
FIG. 1e schematically illustrates one more illustrative embodiment of the presently disclosed subject matter, wherein the illustrative semiconductor device of FIG. 1d is in a further advanced manufacturing stage.

FIG. 1e schematically illustrates the semiconductor device 100 during a deposition process 104, during which a conductive barrier layer 126 may be formed. For example, the deposition process 104 may represent a sputter deposition process, possibly in combination with a preceding sputter etch process, such as the process 103, as previously described. In this case, well-established deposition recipes may be used in order to form a corresponding conductive barrier material, such as tantalum, tantalum nitride and the like. In other cases, the deposition process 104 may represent a CVD process, an atomic layer deposition (ALD) process, an electroless plating process and the like, depending on the desired type of barrier material and a thickness of the layer 126. During the deposition process 104, irrespective of the type of deposition process, the dielectric layer 125 provides enhanced surface conditions within the opening 121A, thereby reducing the probability of creating any voids during the deposition process 104 and during subsequent deposition techniques for filling in a highly conductive metal into the opening 121A. Depending on the overall process strategy, a corresponding metal, such as copper, may be directly deposited on the conductive barrier material 126 by specific electrochemical deposition recipes, while in other cases a seed layer, such as a copper layer, may be formed on the layer 126, for instance by sputter deposition, electroless deposition and the like, in order to provide enhanced conditions for a subsequent electrochemical deposition process, such as electroplating, electroless plating and the like. Thereafter, the metal, such as copper, may be filled into the opening 121A with a desired bottom-to-top fill behavior with moderately high deposition rates, while significant creation of voids may also be reduced due to the superior conditions provided by the layer 125 during the deposition process 104 and any subsequent process steps, such as deposition of a seed layer and the following electrochemical deposition of the metal.

Figure 1F:
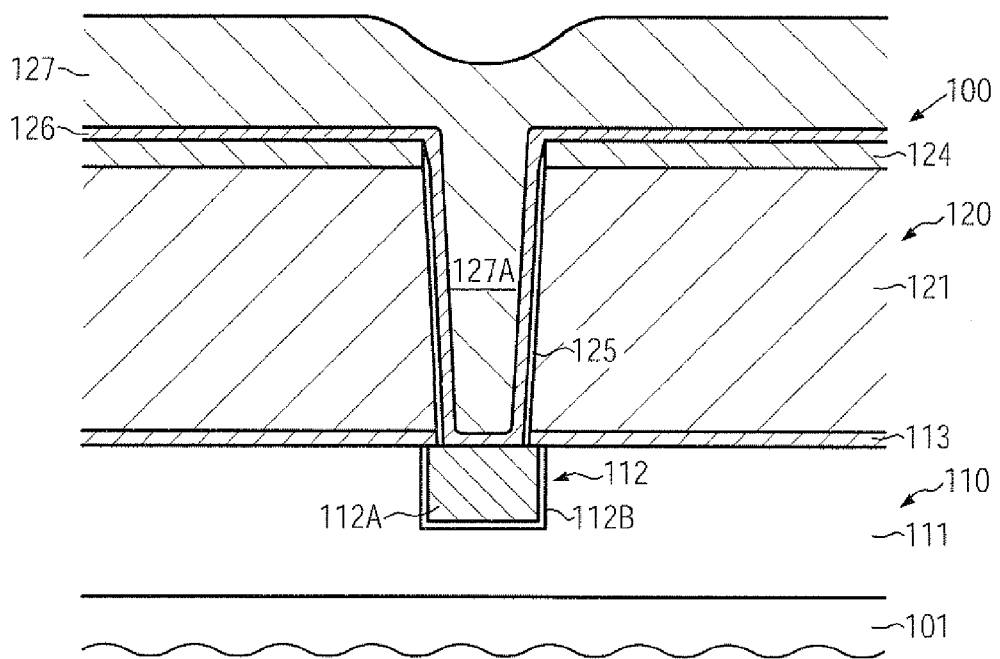
FIG. 1f schematically illustrates the semiconductor device of FIG. 1e in yet another advanced manufacturing stage.

FIG. 1*f* schematically illustrates the semiconductor device 100 after the above-described process sequence. Hence, the device 100 may comprise a metal layer 127, such as a copper layer, which substantially completely fills the opening 121A (FIG. 1*e*), thereby forming a metal region, such as a trench and/or a via that is filled with the metal 127A. Furthermore, the metal region may comprise the conductive barrier material 126, which may be separated from the sensitive low-k dielectric material 121 by the dielectric layer 125. As previously discussed, the dielectric material 125 may be provided with a reduced thickness so as to not unduly affect the overall electrical performance of the metal region 127A. For instance, the thickness of the layer 125, as specified above, may be less than a thickness of the conductive barrier layer 126 so that the overall conductivity of the metal region may not be substantially affected, while on the other hand the probability of creating any voids adjacent to the metal region may be reduced. After the deposition of the metal layer 127, for instance on the basis of electrochemical deposition techniques as described above, any excess material thereof, as well as an undesired portion of the conductive barrier material 126, possibly in combination with the hard mask layer 124, may be removed, for instance by electrochemical etching in combination with chemical mechanical polishing or planarizing techniques (CMP). Consequently, the metallization layer 120 may be formed with enhanced reliability due to the provision of the dielectric layer 125, while substantially not negatively influencing the overall electrical performance with respect to conductivity and parasitic capacitance.

With reference to FIGS. 2*a*-2*g*, further illustrative embodiments will now be described in which a dielectric material may be formed on sidewalls of corresponding openings to achieve additional effects, for instance a diffusion hindering effect, the adjustment of a desired lateral dimension and the like.

Figure 2A:
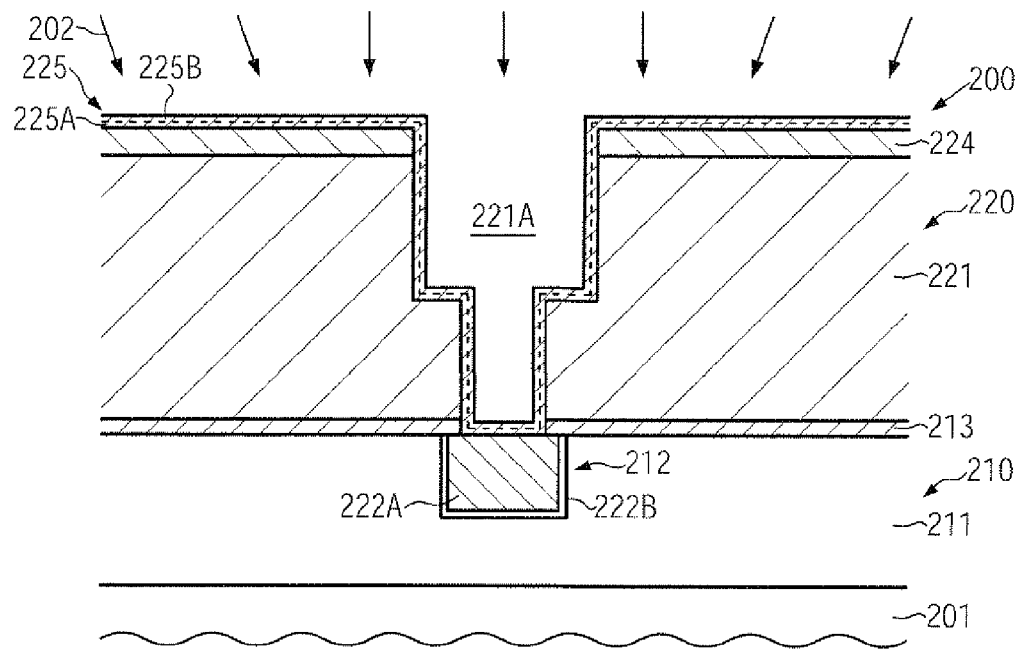
FIG. 2a schematically illustrates a cross-sectional view of a semiconductor device in accordance with another illustrative embodiment of the present disclosure.

FIG. 2*a* schematically illustrates a semiconductor device 200 comprising a substrate 201, above which is provided a device level 210, followed by a metallization layer 220. The device level 210 may comprise a dielectric material 211 and a conductive region, such as a metal region 212 confined by an etch stop layer 213. Similarly, the metallization layer 220 may comprise a low-k dielectric material 221, in which may be formed an opening 221A, which may represent a trench in combination with a via, as is frequently used in dual damascene strategies. Moreover, a hard mask layer 224 may be formed above the dielectric material 221. With respect to the components described so far, the same criteria apply as previously explained with reference to the semiconductor device 100. Similarly, any process techniques as previously described with reference to the device 100 may also be applied when forming the semiconductor device 200. It should be appreciated that the opening 221A may be formed in accordance with well-established patterning regimes, in which first a via opening may be formed on the basis of process techniques previously described with reference to the opening 121A of FIG. 1*b*, followed by a further patterning process for forming a corresponding trench. In other cases, the trench may be formed first, followed by a patterning sequence for forming a corresponding via. Irrespective of the process strategy used, in a final stage of patterning the opening 221A, the conductive region 212 may be exposed and corresponding wet chemical etch processes may have to be performed to remove any unwanted contamination and particles, as previously described. Thereafter, the device 200 may be exposed to a deposition ambient 202 so as to form a dielectric layer 225, which may have diffusion hindering capabilities with respect to a metal that is to be filled into the opening 221A in a later manufacturing stage. For example, the dielectric layer 225 may comprise a nitrogen-containing material, such as silicon nitride, nitrogen-containing silicon carbide and the like, which may be applied on the basis of well-established plasma enhanced CVD techniques in a highly conformal state with a desired small thickness. In other illustrative embodiments, the layer 225 may comprise two or more sub-layers 225A, 225B, at least one of which may provide a metal confining effect. For example, the layer 225A that is in contact with the dielectric material 221 may have the diffusion hindering effect, while the layer 225B may provide the desired surface characteristics with respect to the further processing of the semiconductor device 200. For example, the layer 225B may be provided in the form of a silicon dioxide layer, while the layer 225A may be comprised of silicon nitride, nitrogen-containing silicon carbide and the like. In this manner, well-known surface characteristics of the silicon dioxide material may be used for the further processing, while also a metal diffusion hindering effect may be provided by the dielectric layer 225.

Figure 2B:
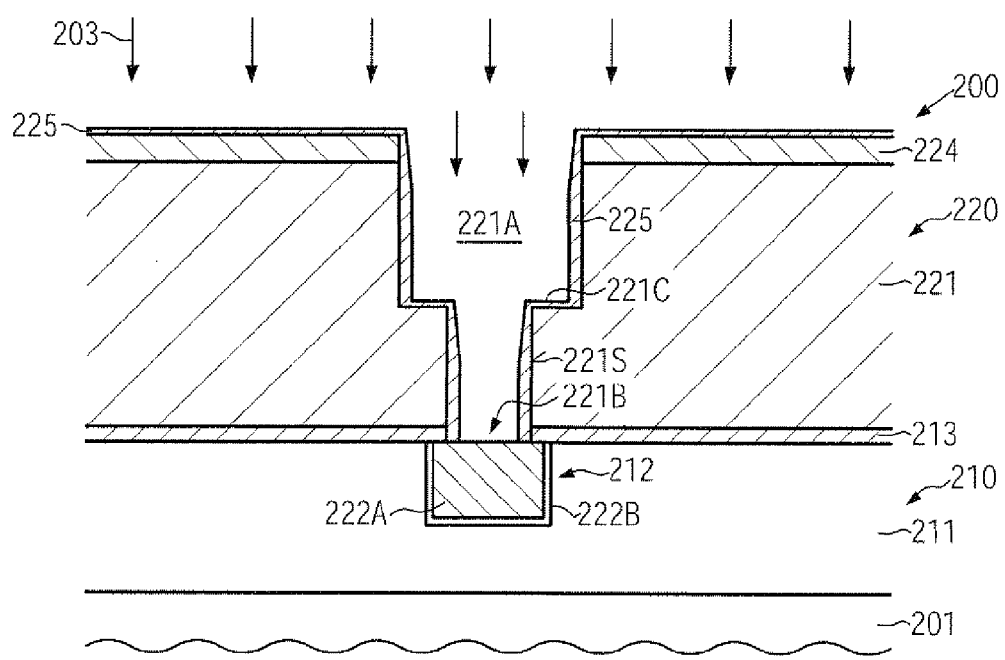
FIG. 2b schematically illustrates a further illustrative embodiment of the semiconductor device shown in FIG. 2a in a further advanced manufacturing stage.

FIG. 2*b* schematically illustrates the semiconductor device 200 during an anisotropic material removal process 203, which may be performed as a sputter etch process, an anisotropic plasma assisted etch process and the like, as previously discussed. Thus, during the removal process 203, material of the layer 225 may preferably be removed from horizontal portions, such as the bottom 221B of the opening 221A and also at horizontal portions 221C within the opening 221A, when the upper portion thereof represents a trench for a metal line of the metallization layer 220. It should be appreciated that the removal rate at the horizontal portions 221C may be less compared to the bottom 221B, if a highly anisotropic sputter etch process may be used, since, in this case, a portion of the material of the layer 225 sputtered off during the process 203 from the portions 221C may immediately be re-deposited thereon due to increased lateral dimensions compared to the lateral dimensions at the bottom 221B, in which a corresponding re-deposition may preferably occur at sidewalls 221S of the opening 221A. Thus, a certain amount of material of the layer 225 may still be preserved at the portions 221C, while nevertheless reliably exposing the bottom 221B. In this case, the diffusion hindering effect of the material layer 225 may be maintained, at least to a certain degree, within the entire opening 221A except for the bottom 221B. In other cases, the material of the dielectric layer 225 may be substantially completely removed at the portion 221C while also a reliable removal at the bottom 221B may be achieved.

Figure 2C:
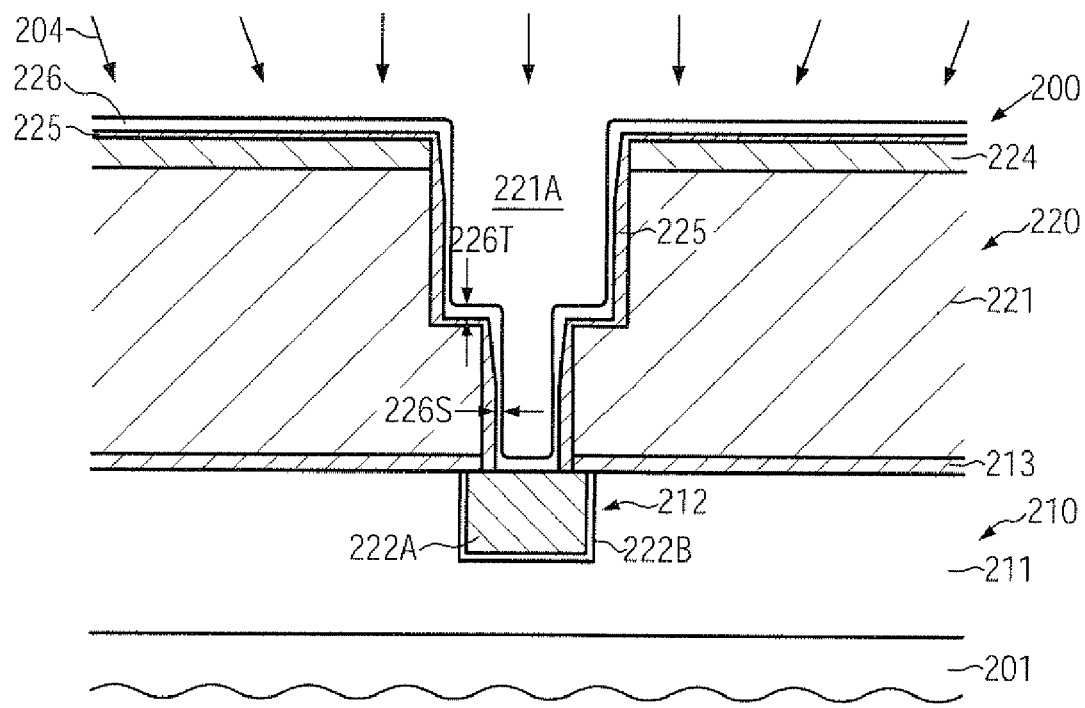
FIG. 2c schematically illustrates yet another illustrative embodiment of the present disclosure, wherein the semiconductor device of FIG. 2b is in yet a further manufacturing stage.

FIG. 2*c* schematically illustrates the semiconductor device 200 during a deposition process 204 for forming a conductive barrier layer 226. For example, sputter deposition techniques for well-established barrier materials, such as tantalum, tantalum nitride and the like, may provide superior crystallinity of a copper material to be deposited on the basis of electrochemical deposition techniques. Thus, providing the barrier material 226 on the basis of sputter deposition techniques may be a preferred technique, wherein, however, a desired reduction in layer thickness of the barrier material 226, for instance with respect to overall electrical performance, may be difficult to achieve since a reliable coverage of the lower sidewall portions 221S (see FIG. 2*b*) may require the deposition of a significant thickness of the barrier material 226, which may contribute to an increased thickness 226T at the horizontal portions 221C (see FIG. 2b), which may represent the bottom of corresponding metal lines still to be formed. Thus, for a reliable coverage of the lower sidewall portions 221S requiring a thickness of, for instance, several tenths of nanometers, as indicated by 226S, a significantly increased thickness 226T may be produced, thereby conventionally contributing to reduced performance of the corresponding metal lines. However, in the embodiment shown, the remaining dielectric material 225 may provide a desired diffusion hindering effect so that a corresponding thickness 226S may be selected moderately thin, since even a non-continuous coverage of the sidewall portions 221S may be less critical due to the presence of the dielectric material 225. Consequently, the deposition of the material 226 may be controlled such that a desired minimum thickness 226T at the horizontal portions 221C may be achieved, thereby contributing to overall performance of the corresponding metal lines. For instance, the thickness 226T may be selected to be approximately 30 nm or less at the horizontal portions 221C.

In other illustrative embodiments, the deposition of the conductive barrier material 226 may be omitted if a sufficient thickness of the dielectric layer 225 may be maintained at the horizontal portions 221C, as is also explained above with reference to FIG. 2b. In this case, an appropriate seed material may be directly deposited on the material layer 225, followed by a corresponding electrochemical deposition process.

With reference to FIGS. 2d-2g, further illustrative embodiments will now be described in which the additional dielectric material may be deposited so as to re-establish or adjust a desired lateral size of the corresponding openings in the low-k dielectric material.

Figure 2D:
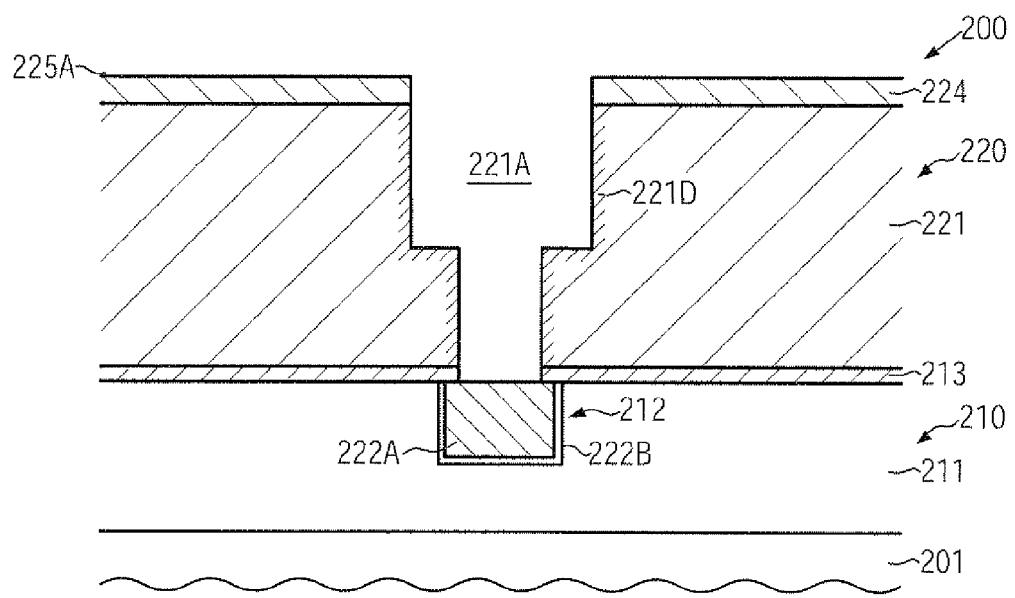
FIG. 2d schematically illustrates a cross-sectional view of yet another illustrative embodiment of a semiconductor device in accordance with the present disclosure.

FIG. 2d schematically illustrates the semiconductor device 200 after the patterning sequence for forming the opening 221A in the low-k dielectric material 221. As previously explained, the complex patterning regime in combination with respective resist removal processes and wet chemical etch steps may result in a certain degree of damage of exposed portions of the opening 221A, as indicated by 221D. In particular, ULK materials and porous low-k dielectric materials may suffer from a corresponding etch damage, which may represent a significant reliability issue during the further processing of the device 200 and the operation of completed semiconductor devices.

Figure 2E:
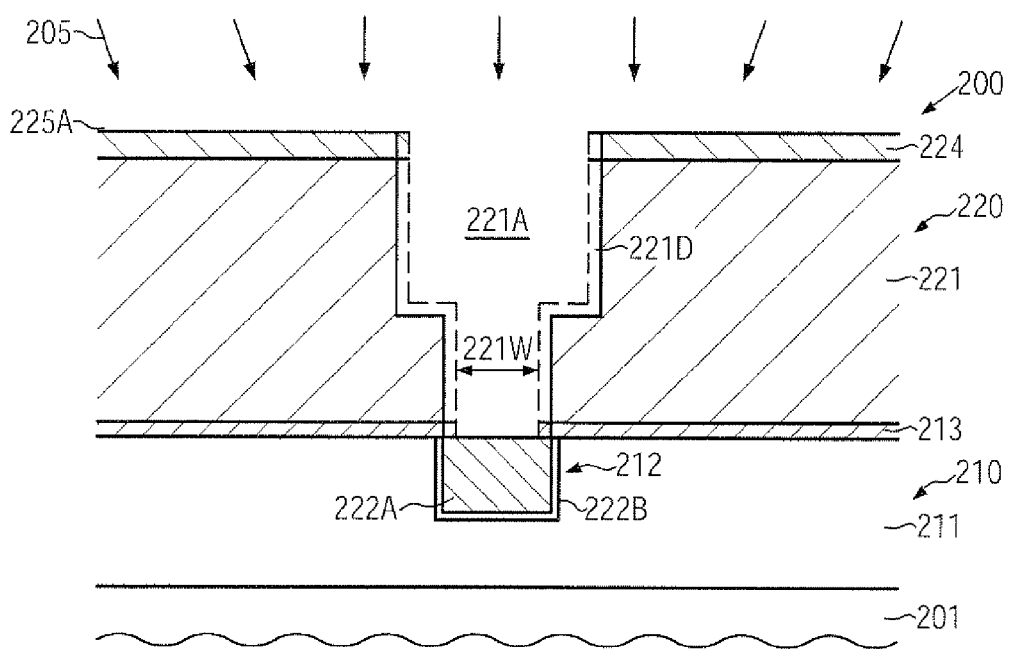
FIG. 2e schematically illustrates another illustrative embodiment disclosed herein, which depicts the illustrative semiconductor device shown in FIG. 2d in an advanced manufacturing stage.

FIG. 2e schematically illustrates the semiconductor device 200 when exposed to an isotropic etch ambient 205, which is configured to enable the removal of exposed portions of the dielectric material 221. For example, hydrofluoric acid or other chemicals may be efficiently used in order to remove the damaged portion 221D of the dielectric material 221. Consequently, during the etch process 205 and the removal of the damaged portions 221D, the initial lateral dimension 221W of the opening 221A may be increased, depending on the amount of material removed. However, in sophisticated device configurations, a corresponding increase of the lateral dimension 221W may have an influence on the overall electrical performance, for instance with respect to parasitic capacitance and the like, and may have to be taken into consideration during the patterning of the initial opening 221A. In this case, however, the corresponding lithography and patterning sequence may have to meet more restrictive constraints, which frequently may not be compatible with the capabilities of the corresponding lithography and patterning strategies. In this case, the increased lateral width may be reduced to any appropriate value, for instance to the initial value 221W, by providing the additional dielectric materials.

Figure 2F:
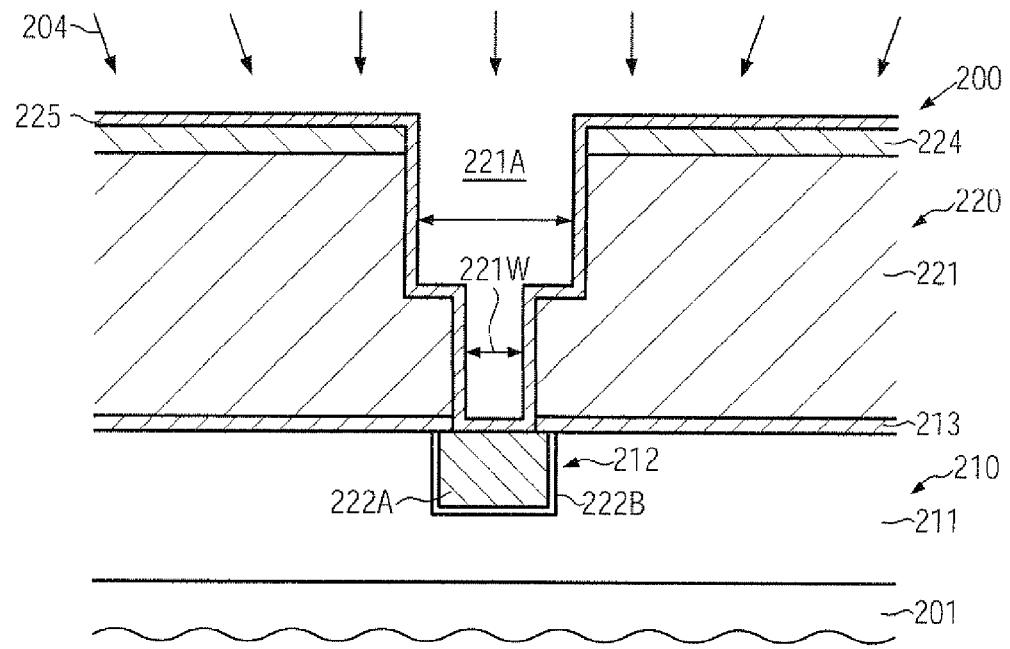
FIG. 2f schematically illustrates an illustrative embodiment of the semiconductor device of FIG. 2e in a further advanced manufacturing stage.

FIG. 2f schematically illustrates the semiconductor device 200 during the deposition process 204, in which the dielectric material 225 may be formed so as to obtain a desired lateral size of the opening 221A. For example, the dielectric material 225 may be provided in the form of any appropriate dielectric material, such as silicon dioxide and the like, so as to provide the desired surface conditions, wherein a thickness thereof may be selected in accordance with requirements for the desired lateral size 221W. For example, the thickness may be such that the initial width 221W is re-established. In other cases, an even further reduced lateral dimension may be obtained, thereby enabling performing the previous lithography and patterning sequence for forming the opening 221A on the basis of less restrictive constraints. It should be appreciated that a corresponding adjustment of the lateral dimensions by means of the dielectric layer 225 may also be accomplished without removing material from within the opening 221A, when the previous patterning sequence may not result in the damaged portion 221D (FIGS. 2d-2e). Consequently, in this case, a desired lateral size may be adjusted, while at the same time desired surface conditions may be provided by means of the dielectric layer 225 for the further processing of the device 200. As previously explained, the dielectric material 225 may be comprised of two or more material compositions, depending on the overall process strategy. For instance, if a pronounced thickness of the damaged portion 221D may have to be removed, a replacement of these portions or even an overcompensation of this portion may have an influence on the overall permittivity of the metallization layer 220, a dielectric material of reduced dielectric constant may be used. In this case, a portion of the dielectric material 221 may be provided in the form of a low-k material, followed by a material providing the desired surface conditions, such as silicon dioxide. Consequently, in this case, any desired lateral size may be adjusted without significantly affecting the overall electrical performance of the metallization layer 220.

Figure 2G:
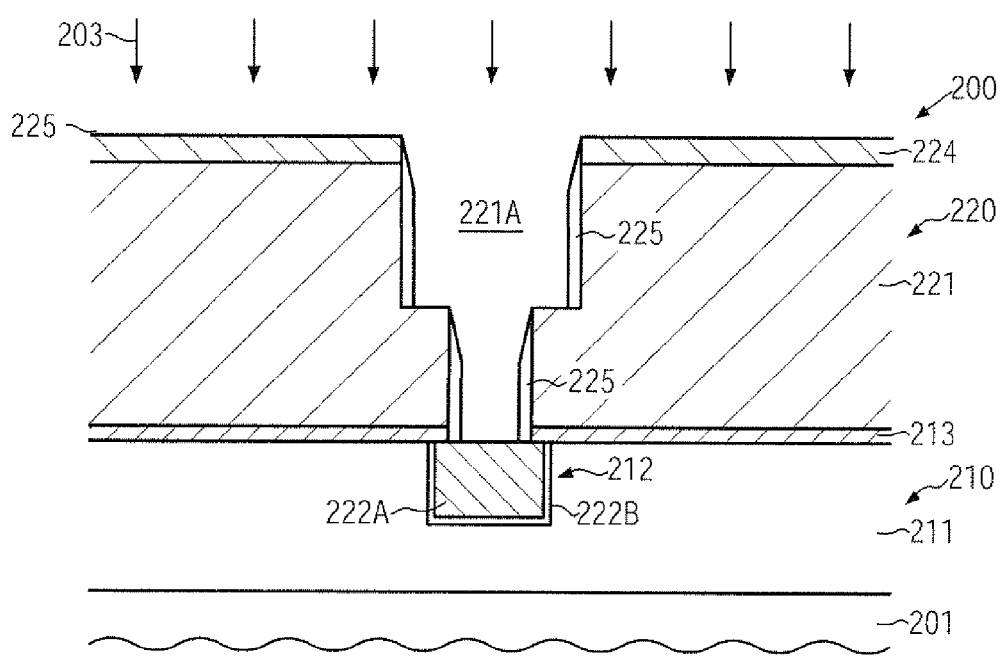
FIG. 2g schematically illustrates yet another illustrative embodiment of the present disclosure, wherein the semiconductor device of FIG. 2f is in yet a further manufacturing stage.

FIG. 2g schematically illustrates the semiconductor device 200 during the anisotropic removal process 203, in which material of the layer 225 may preferably be removed from horizontal surface portions, as previously explained. Thus, the sidewalls of the opening 221A may remain covered by the layer 225, while also a desired lateral size may be substantially maintained. Thereafter, the further processing may be continued, as previously described, for instance by depositing a conductive barrier material, possibly in combination with a seed material, and subsequently a copper-containing metal may be deposited, for instance by electrochemical deposition techniques.

As a result, the present disclosure provides semiconductor devices and methods in which enhanced surface conditions may be provided prior to depositing a metal-containing material for filling openings in a low-k dielectric material, without significantly affecting the overall electrical performance of the metallization layer under consideration. For example, silicon dioxide or any other appropriate material may be used as a layer for protecting exposed sidewall portions of an opening in a sensitive low-k dielectric material prior to the deposition of metal-containing materials, such as conductive barrier materials and the like, thereby reducing the probability of creating additional defects, which may conventionally be observed. Furthermore, the diffusion hindering effect may be enhanced even for a reduced thickness of a conductive barrier material while also a desired lateral size of the openings may be adjusted on the basis of the additional dielectric material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming an opening having an initial lateral size in a low-k dielectric layer of a metallization layer formed above a substrate of a semiconductor device;

after forming said opening, performing an etch process to increase said initial lateral size of said opening;

after increasing said initial lateral size of said opening, forming a dielectric layer in said opening with a thickness that substantially re-establishes said initial lateral size of said opening, said dielectric layer having a higher density relative to said low-k dielectric layer;

exposing a conductive material of a conductive region at a bottom of said opening by removing material of said dielectric layer;

depositing a conductive barrier material in said opening; and filling said opening with a metal.

2. The method of claim 1, wherein said dielectric layer comprises silicon dioxide.

3. The method of claim 1, wherein filling said opening with said metal comprises forming a metal layer by an electrochemical deposition technique.

4. The method of claim 1, further comprising forming a seed layer on said conductive barrier layer.

5. The method of claim 1, wherein forming said dielectric layer comprises forming a first dielectric layer on exposed sidewall surfaces of said opening and forming a second dielectric layer on said first dielectric layer.

6. The method of claim 5, wherein at least one of said first and second dielectric layers comprises nitrogen.

7. The method of claim 1, wherein said dielectric layer comprises a dielectric material having a diffusion hindering effect with respect to an atomic species of said metal.

8. The method of claim 7, wherein said dielectric material of said dielectric layer comprises nitrogen.

9. The method of claim 7, wherein said conductive barrier material is deposited so as to have a thickness of approximately 30 nm or less at horizontal surface areas outside of said opening.

10. A method, comprising:

forming an opening in a low-k dielectric material of a metallization layer of a semiconductor device;

after forming said opening, performing an isotropic etch process so as to remove a portion of said low-k dielectric material within said opening;

after performing said isotropic etch process, depositing a layer of low-k dielectric material;

after depositing said layer of low-k dielectric material, forming a silicon dioxide material above exposed surfaces of said opening;

removing said silicon dioxide material at a bottom of said opening, while maintaining at least a portion of said silicon dioxide material at sidewalls of said opening; and filling said opening with a metal-containing conductive material.

11. The method of claim 10, further comprising depositing a conductive barrier material in said opening after removing said silicon dioxide material from the bottom of said opening.

12. The method of claim 11, further comprising forming a seed layer on said conductive barrier material.

13. The method of claim 10, further comprising forming a dielectric barrier material above said surfaces of said opening.

14. The method of claim 13, wherein said dielectric barrier material is formed on said surfaces.

* * * * *